tion No. 09/493,251, filed on
United States Patent
Hikita et al.

(10) Patent No.: US 7,088,983 B2
(45) Date of Patent: Aug. 8, 2006

(54) SEMICONDUCTOR DEVICE FOR RADIO COMMUNICATION DEVICE, AND RADIO COMMUNICATION DEVICE USING SAID SEMICONDUCTOR DEVICE

(75) Inventors: Junichi Hikita, Kyoto (JP); Hiroo Mochida, Kyoto (JP); Katsutoshi Nagi, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 288 days.

(21) Appl. No.: 10/654,919

(22) Filed: Sep. 5, 2003

(65) Prior Publication Data

US 2004/0043732 A1    Mar. 4, 2004

Related U.S. Application Data

(63) Continuation of application No. 09/493,251, filed on Jan. 28, 2000, now abandoned.

(30) Foreign Application Priority Data

Feb. 3, 1999    (JP)    ................................. 11-026540

(51) Int. Cl.
    *H04B 1/28*    (2006.01)
(52) U.S. Cl. ............... 455/333; 455/84; 455/76; 455/83; 257/777; 257/713; 257/719; 257/750; 257/751; 257/758; 361/704
(58) Field of Classification Search ................ 257/777, 257/713, 719; 361/704; 438/108; 399/98; 455/76, 83, 333, 84; 275/750, 751, 758; 389/329
See application file for complete search history.

(56) References Cited

U.S. PATENT DOCUMENTS

| 5,294,836 | A |   | 3/1994  | Kishi |
|-----------|---|---|---------|-------|
| 5,444,863 | A |   | 8/1995  | Torii |
| 5,603,097 | A |   | 2/1997  | Kanou |
| 5,903,820 | A |   | 5/1999  | Hagstrom |
| 6,163,076 | A | * | 12/2000 | Lee et al. .................. 257/777 |
| 6,347,037 | B1| * | 2/2002  | Iijima et al. ............... 361/704 |
| 6,399,419 | B1|   | 6/2002  | Shibata et al. |

FOREIGN PATENT DOCUMENTS

| GB | 2 307 596  | 5/1997  |
| JP | 54-10971   | 1/1979  |
| JP | 63-111659  | 5/1988  |
| JP | 01-122147  | 5/1989  |
| JP | 04-334053  | 11/1992 |
| JP | 05-109977  | 4/1993  |
| JP | 5-152448   | 6/1993  |
| JP | 06-216802  | 8/1994  |
| JP | 09-148373  | 6/1997  |
| JP | 10-256467  | 9/1998  |
| JP | 11168303   | 6/1999  |

* cited by examiner

*Primary Examiner*—Joseph Feild
*Assistant Examiner*—David Q. Nguyen
(74) *Attorney, Agent, or Firm*—Rabin & Berdo, P.C.

(57) ABSTRACT

A chip-on-chip-structure semiconductor device for a radio communication device, having a base band chip and a high-frequency chip piled up on and bonded to the surface thereof. The base band chip has a low-frequency signal processing unit for processing a signal in a first frequency band. The high-frequency chip has a high-frequency signal processing unit for processing a signal in a second frequency band of which frequency is higher than that of the first frequency band.

16 Claims, 2 Drawing Sheets

SEMICONDUCTOR DEVICE FOR RADIO COMMUNICATION DEVICE, AND RADIO COMMUNICATION DEVICE USING SAID SEMICONDUCTOR DEVICE

This application is a continuation Application of Ser. No. 09/493,251 filed Jan. 28, 2000 now abandoned.

BACKGROUND OF THE INVENTION

1. Field of the Invention

The present invention relates to a semiconductor device to be applied for a radio communication device such as a mobile phone or the like, and also to a radio communication device using said semiconductor device.

2. Description of Related Art

FIG. 3 is a block diagram illustrating the electric arrangement of a mobile phone of which typical examples include a vehicle phone and a portable phone. An antenna 10 for transmitting and receiving a radio signal, is connected to a switch unit 1 for separating a transmission signal and a reception signal from each other. Connected to this switch unit 1 are a transmitter unit 2 and a receiver unit 3. A signal from a digital signal processing unit 5 (signal processing unit) is given to the transmitter unit 2 through a suitable filter circuit (not shown) after modulated by a modulator unit 4. A signal received by the receiver unit 3 is frequency-converted by mixers 6, 7, then filtered by band-pass filters 8, 9, then demodulated by a demodulator unit 11, and finally entered into the digital signal processing unit 5.

The transmitter unit 2 is formed by a gallium-arsenic compound semiconductor chip in which there are integrated (i) a mixer 21 for frequency-converting an intermediate-frequency signal corresponding to the contents to be transmitted, into a transmission-frequency signal, and (ii) an amplifying circuit 22 for amplifying an output signal of this mixer 21.

The receiver unit 3 is formed by a gallium-arsenic compound semiconductor chip in which there are integrated (i) an amplifying circuit 31 for amplifying a reception signal, (ii) a mixer 32 for converting, into a first intermediate-frequency signal, a reception-frequency signal supplied from a band-pass filter 12 for filtering an output signal of the amplifying circuit 31, and (iii) a local oscillator 33 for giving, to the mixer 32, a reference-frequency signal for frequency-conversion.

The mixers 6, 7 mix reference-frequency signals (of which phases are shifted from each other at the mixers 6, 7 by a phase shifter 14) from a local oscillator 13, with a first intermediate-frequency signal from the receiver unit 3. Thus, the mixers 6, 7 generate second intermediate-frequency signals lower in frequency than the first intermediate-frequency signal, and these second intermediate-frequency signals are entered into the demodulator unit 11 through band-pass filters 8, 9.

The modulator unit 4, the demodulator unit 11 and the digital signal processing unit 5 are arranged, for example, as integrated in a single silicon semiconductor chip.

Each of the band-pass filters 8, 9, 12 is formed by a surface acoustic wave (SAW) filter for processing a high-frequency signal favorably. The surface acoustic wave filter may be arranged by forming a comb-like electrode on the surface of a piezoelectric board made of ceramics and the like (alumina and the like).

The electric circuit of a mobile phone shown in FIG. 3 comprises a gallium-arsenic compound semiconductor chip forming the switch unit 1, a gallium-arsenic compound semiconductor chip forming the transmitter unit 2, a gallium-arsenic compound semiconductor chip forming the receiver unit 3, three silicon semiconductor chips respectively forming the band-pass filters 8, 9, 12, and a silicon semiconductor chip BC forming the modulator unit 4 and the like. These chips are bonded to one another on a printed circuit board by a flip-chip-bonding for example, thus forming the electric circuit of a mobile phone.

According to the arrangement above-mentioned, however, the inter-chip wiring lengths are inevitably long. This produces losses due to wiring reflection particularly at high-frequency processing units. To reduce such losses, matching circuits formed by microstrip filters and the like are interposed in the inter-chip wirings for impedance matching.

However, it is complicated to provide an arrangement for interposing such matching circuits in the inter-chip wirings. Further, microstrips should be formed on the board. This is disadvantageous in that the printed circuit board is inevitably increased in size to impede the miniaturization of a mobile phone. Although the use of the matching circuits can reduce the losses, the degree of loss reduction is not always satisfactory. Particularly in a portable phone of which power fully relies on the incorporated battery, the demand for reduction in power consumption is very high. Therefore, it is a matter of course that a further reduction in loss among the inter-chip wirings is desired.

If all the components can be integrated in a single semiconductor chip, the problem above-mentioned would be solved. However, it is difficult to form, by a silicon semiconductor, each of the switch unit 1, the transmitter unit 2, the receiver unit 3 and the like in which high-speed operation (800 MHz~2 GHz:second frequency band) is required. On the other hand, it is not practical in view of process and cost to form, by a gallium-arsenic compound semiconductor chip, each of the modulator unit 4, the demodulator unit 11 and the like which are low-speed operational units (10~200 MHz: first frequency band). Further, it is inevitable to form, as individual elements, the band-pass filters 8, 9, 12 each of which is formed by a surface acoustic wave filter. It is therefore not possible to integrate all the components in a single semiconductor chip.

SUMMARY OF THE INVENTION

It is an object of the present invention to provide a semiconductor device for a radio communication device, of which arrangement can be simplified and in which the losses in the inter-chip wirings can be reduced, and also to provide a radio communication device using such a semiconductor device.

It is another object of the present invention to provide a semiconductor device for a radio communication device, having the arrangement advantageous in view of miniaturization, and also to provide a radio communication device using such a semiconductor device.

The present invention provides a semiconductor device for a radio communication device, having a low-frequency signal processing unit and a high-frequency signal processing unit in both of which there is received or transmitted a signal after frequency-conversion between a first frequency band and a second frequency band of which frequency is higher than that of the first frequency band, and this semiconductor device comprises: a base band chip having a low-frequency signal processing unit for processing a signal in the first frequency band; and a high-frequency chip piled up on and bonded to the surface of the base band chip, and having a high-frequency signal processing unit for processing a signal in the second frequency band of which frequency is higher than that of the first frequency band.

According to the arrangement above-mentioned, the high-frequency chip is piled up on and bonded to the surface of the base band chip, thus forming a so-called chip-on-chip-structure semiconductor device. This minimizes the wiring length between the base band chip and the high-frequency chip. Even though a plurality of high-frequency chips are formed on the base band chip, the wiring lengths among these high-frequency chips formed on the same base band chip, are very small. Accordingly, the losses due to reflection in the wirings of which lengths are very small, can substantially be disregarded. This not only avoids the need of matching circuits, enabling the arrangement to be simplified, but also remarkably reduces the losses in the inter-chip wirings. The reduction in loss in the inter-chip wirings can reduce the power consumption. This lengthens the lifetime of the incorporated battery of a mobile phone or the like.

Further, since the chip-on-chip-structure semiconductor device can be handled substantially as a single chip, the electric component unit of a radio communication device can be reduced in size, thickness and weight. This results in great contribution to the miniaturization of a radio communication device.

As compared with a conventional arrangement in which a plurality of chips and microstrip filters are mounted on a printed circuit board, the arrangement for electromagnetic shield in this invention can be simplified and reduced in size. This also enables a radio communication device to be miniaturized.

Preferably, the base band chip and the high-frequency chip are disposed with the surfaces of both chips opposite to each other, and are connected to each other by an inter-chip connection member interposed between these opposite surfaces.

According to the arrangement above-mentioned, the inter-chip connection member provides a gap between the base band chip and the high-frequency chip. Therefore, for example a high-frequency chip having a surface acoustic wave element can be bonded, with the face down, to the surface of the base band chip. With the chips thus bonded to each other, there can advantageously be assured, between the chip surfaces, an operational space which allows the surface acoustic wave element to operate favorably.

The inter-chip connection member may comprise a metal projection formed on the surface of the base band chip and/or on the surface of the high-frequency chip. Examples of such a metal projection include a so-called bump. However, there may be used, as the metal projection, a metallized layer of which height is not so high as a bump.

The low-frequency signal processing unit formed on the base band chip may comprise a demodulator unit for demodulating a reception signal, and/or a signal processing unit for processing a signal demodulated by the demodulator unit.

The high-frequency signal processing unit integrated on the high-frequency chip may comprise a transmitter unit for giving a transmission signal to an antenna, and/or a receiver unit for frequency-converting a reception signal from the antenna and giving the frequency-converted reception signal to the demodulator unit. The transmitter unit and the receiver unit may be formed on respectively different high-frequency chips.

The receiver unit may comprise a filter for filtering a reception signal from the antenna. In such a case, the filter may be a surface acoustic wave filter. The surface acoustic wave filter which is an example of the surface acoustic wave element, can favorably be operated as bonded to the base band chip as mentioned earlier.

The high-frequency signal processing unit may be a switch unit which is arranged to select a transmission signal from the transmitter unit and give the same to the antenna, and which is arranged to select a reception signal from the antenna and give the same to the receiver unit. In such a case, the switch unit may be formed on a high-frequency chip different from the high-frequency chip on which the transmitter unit and the receiver unit are formed.

A radio communication device according to the present invention comprises a semiconductor device for a radio communication device having the arrangement above-mentioned, and a transmission/reception antenna connected to this semiconductor device for a radio communication device.

The arrangement above-mentioned reduces the sizes of the electric component unit, thus enabling the radio communication device to be miniaturized. The miniaturization of the electric component unit results in simplification and miniaturization of the electromagnetic shield structure. This further reduces the radio communication device in size.

These and other features, objects and advantages of the present invention will be more fully apparent from the following detailed description set forth below when taken in conjunction with the accompanying drawings.

DESCRIPTION OF THE PREFERRED EMBODIMENTS

Figure 1:
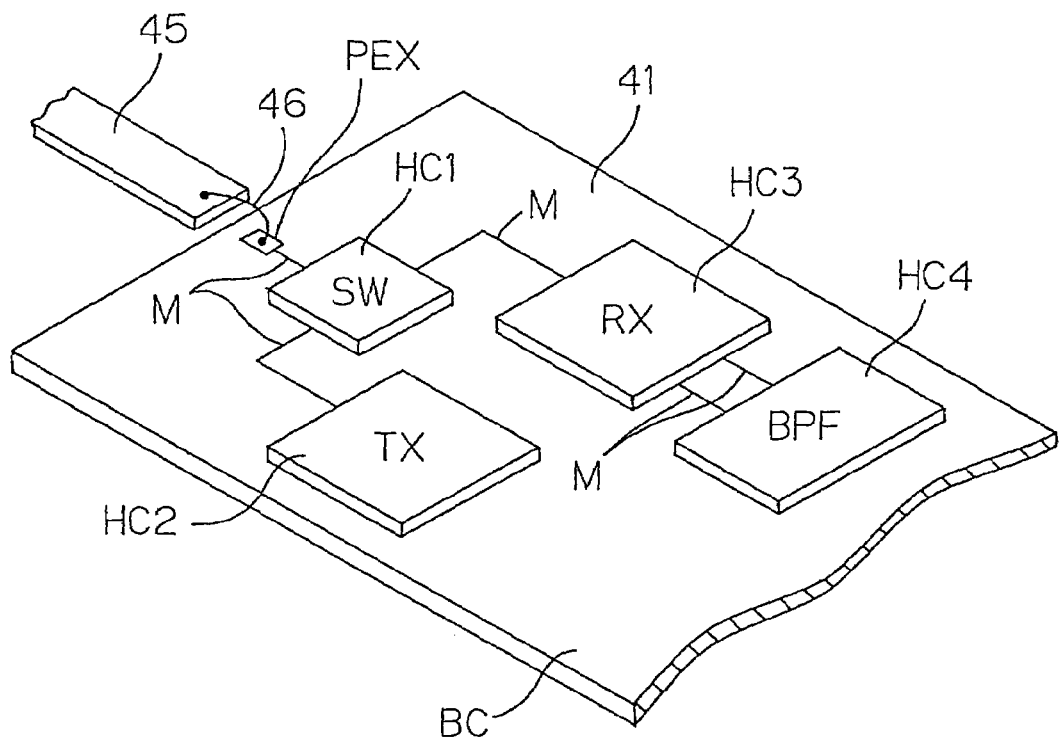
FIG. 1 is a perspective view illustrating the arrangement of a semiconductor device forming the transmitter/receiver units and the like of a mobile phone, according to an embodiment of the present invention.
Figure 3:
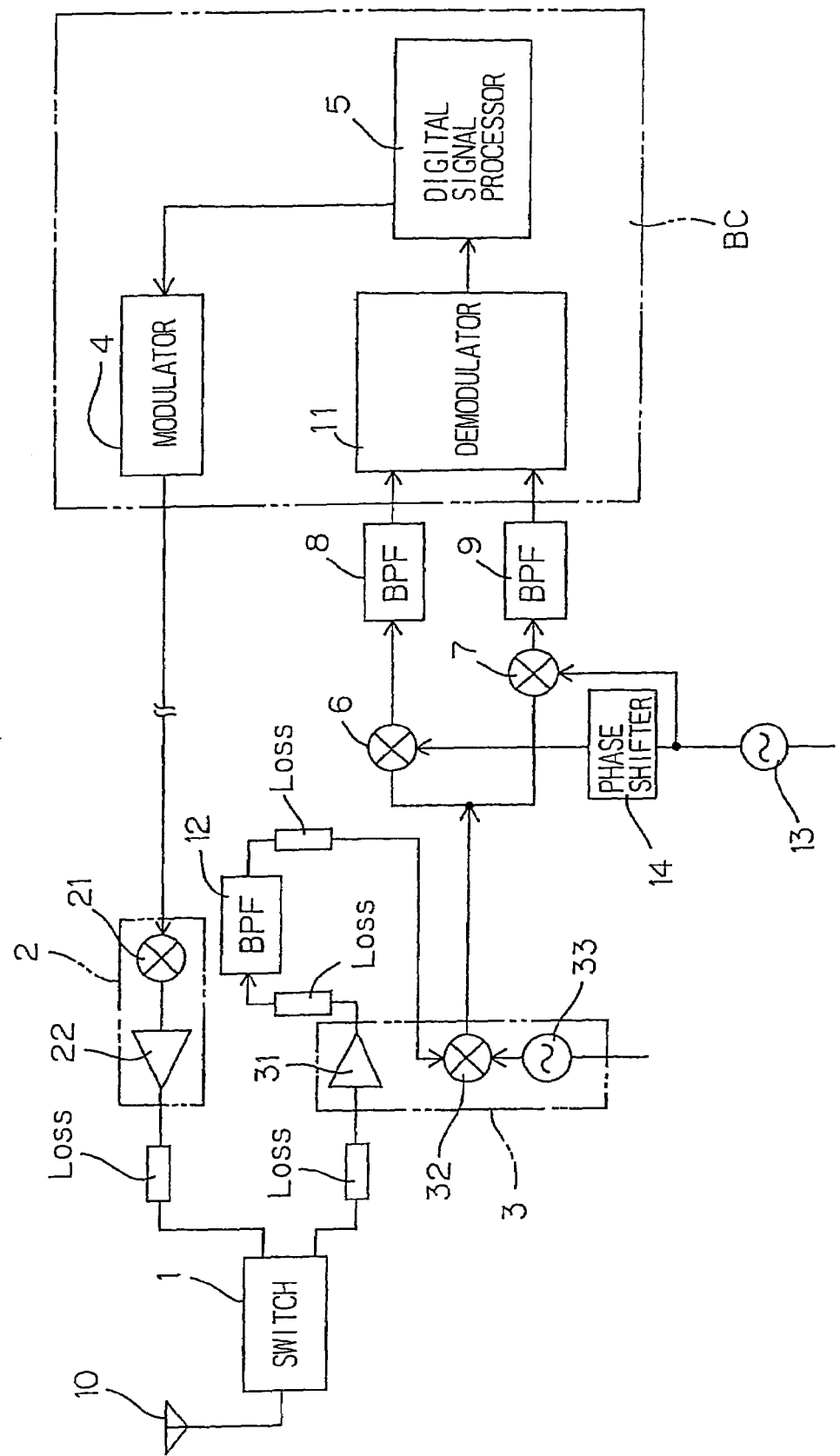
FIG. 3 is a block diagram illustrating the electric arrangement of a mobile phone of which typical examples include a vehicle phone and a portable phone.

FIG. 1 is a perspective view illustrating the arrangement of a semiconductor device forming the transmitter/receiver units and the like of a mobile phone, according to an embodiment of the present invention. The electric arrangement of the mobile phone according to this embodiment, is the same as that shown in FIG. 3. Accordingly, to avoid a repeated explanation, the following description will be made with reference to FIG. 3.

This embodiment provides a chip-on-chip-structure semiconductor device in which a plurality of high-frequency chips HC1, HC2, HC3, HC4, . . . (hereinafter referred to as "high-frequency chips HC" when these chips are collectively referred to) are piled upon and bonded to, with the surfaces down, the surface 41 of a base band chip BC.

The base band chip BC is formed by a silicon semiconductor chip in which integrated are a modulator unit 4, a digital signal processing unit 5 and a demodulator unit 11. The high-frequency chip HC1 is formed by a gallium-arsenic compound semiconductor chip in which is integrated a switch unit (SW) 1 which is arranged to select a transmission signal from the transmitter unit 2 and give the same to the antenna 10, and which is arranged to select a reception signal from the antenna 10 and give the same to the receiver unit 3. The high-frequency chip HC2 is formed by a gallium-arsenic compound semiconductor chip in which the transmitter unit (TX) 2 is integrated. The high-frequency chip HC3 is formed by a gallium-arsenic compound semiconductor chip in which the receiver unit (RX) 3 is integrated. The high-frequency chip HC4 is formed by a piezoelectric substrate having a band-pass filter (BPF) 12 formed by a surface acoustic wave filter. In addition, other semiconductor chips such as silicon semiconductor chips forming band-pass filters 8, 9, are piled up on and bonded to the surface 41 of the base band chip BC. However, these chips are not shown in FIG. 1.

Figure 2:
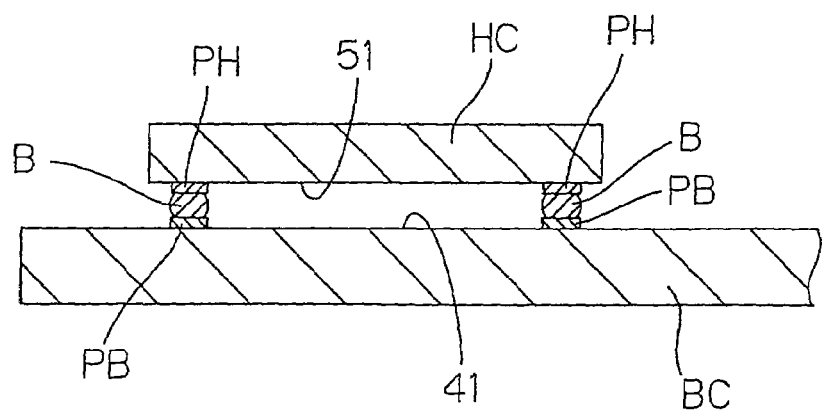
FIG. 2 is a schematic section view illustrating how to bond the base band chip and each high-frequency chip to each other.

FIG. 2 is a schematic section view illustrating how to bond the base band chip and each of the high-frequency chips HC to each other. The opposite surfaces 41, 51 of the base band chip BC and each of the high frequency chips HC, are the active-layer-area-side surfaces of the semiconductor substrates forming the base bodies of the chips, elements such as transistors and the like being mounted on these active-layer-area-side surfaces. Each of the surfaces 41, 51 is coated with a protective layer comprised of an insulating material such as silicon nitride or the like. A plurality of chip connection pads PB, PH are formed on the protective layers. Bumps B made of a non-oxidizable metal such as gold, lead, platinum, silver or iridium, are formed on the surfaces of the chip connection pads PH at the sides of the high-frequency chips HC.

With the surfaces 51 facing the surface 41 of the base band chip BC, the high-frequency chips HC are bonded to the base band chip BC. More specifically, with a plurality of bumps B respectively coming in contact with the chip connection pads PB, the base band chip BC and each of the high-frequency chips HC are mutually contact-bonded to each other. At the time of contact-bonding, ultrasonic vibration may be given to the base band chip BC and/or each of the high-frequency chips HC as necessary. This achieves a secure bonding between the bumps B and the chip connection pads PB.

The electric connection between the high-frequency chips HC and the base band chip BC is achieved through the chip connection pads PH, the bumps B and the chip connection pads PB. The electric connection among the high-frequency chips HC may be executed by aluminium wirings formed inside of the base band chip BC, or by metallic wirings M formed on the surface 41 of the protective layer of the base band chip BC, as shown in FIG. 1. For example, when thin layers (metallized layers) of non-oxidizable metal (such as gold, lead, platinum, silver or iridium) are formed on the surfaces of the chip connection pads PB, it is preferable to simultaneously form the metallic wirings M at the step of forming such metallic thin layers with the use of the same material thereof.

The bumps B may be formed on the chip connection pads at the sides of the high-frequency chips HC and/or the base band chip BC. Accordingly, when the bumps B are formed on the chip connection pads PB of the base band chip BC, the metallic wirings M may be formed with the use of the same material of the bumps B simultaneously with the formation thereof.

In the vicinity of the periphery of the surface 41 of the base band chip BC, there is formed an external connection pad PEX (See FIG. 1) connected to the high-frequency chip HC1 by a metallic wiring M (or a wiring inside of the base band chip BC). This external connection pad PEX is connected to a lead frame 45 by a bonding wire 46. The base band chip BC and the high-frequency chips HC connected thereto in a chip-on-chip manner, are resin-encapsulated with the tip end of the lead frame 45 exposed to the outside. Thus, a plurality of chips BC, HC are housed in a single package.

According to this embodiment having the arrangement above-mentioned, there is formed a chip-on-chip-structure semiconductor device in which the high-frequency chips HC are piled up on and bonded to the surface 41 of the base band chip BC, and this semiconductor device forms the electric component unit of a mobile phone. Such an arrangement minimizes the lengths of the inter-chip wirings, enabling the signal reflection in the inter-chip wirings to be substantially disregarded. This remarkably reduces the losses in the inter-chip wirings so that desired characteristics can be assured with no interposition of matching circuits in the course of the wirings.

Thus, since the arrangement can be simplified and the chip-on-chip-structure semiconductor device can be handled substantially as a single chip, the electric component unit of a mobile phone can remarkably be reduced in size. This enables the mobile phone to be miniaturized.

Further, with the miniaturization of the electric component unit, the arrangement for electromagnetic shield can also be simplified and reduced in size. This also enables the mobile phone to be miniaturized.

Further, since the losses in the inter-chip wirings can remarkably be reduced, the power consumption can be reduced. This lengthens the lifetime of the incorporated battery serving as the internal power source.

In the high-frequency chip HC4 forming the surface acoustic wave filter, the bumps B and the like assure, between its surface and the surface 41 of the base band chip BC, an operational space of the surface acoustic wave filter element. This enables the surface acoustic wave filter to be operated in a good manner.

The foregoing has discussed an embodiment of the present invention, but this invention can also be embodied in another form. For example, a mobile phone has been taken as an example in this embodiment, but a similar arrangement can also be applied to other radio communication device having a high-frequency unit and a low-frequency unit.

The embodiment above-mentioned has discussed, as an example, the semiconductor device in which the base band chip BC is formed by a silicon chip, the high-frequency chips HC1, HC2, HC3 are formed by gallium-arsenic compound semiconductor chips and the high-frequency chip HC4 is formed by a piezoelectric substrate. According to the required characteristics, however, there may be used, as the semiconductor material of each chip, an optional semiconductor material such as silicon, a gallium-arsenic compound semiconductor, a gallium-phosphorus compound semiconductor, a germanium semiconductor or the like. The base band chip and the high-frequency chips may be formed by the same material or respectively different materials. Further, the high-frequency chips HC1, HC2, HC3 may be formed in a single chip.

Embodiments of the present invention have been discussed in detail, but these embodiments are mere specific examples for clarifying the technical contents of the present invention. Therefore, the present invention should not be construed as limited to these specific examples. The spirit and scope of the present invention are limited only by the appended claims.

This application claims priority benefits under 35 USC § 119 of Japanese Patent Application Serial No. 11-26540, filed on Feb. 3, 1999, the disclosure of which is incorporated herein by reference.

What is claimed is:

1. A semiconductor device for a radio communication device in which a signal is received or transmitted a signal after frequency-conversion between frequency bands, the frequency bands including a first frequency band and a second frequency band that is higher in frequency than the first frequency band, wherein a semiconductor device for a radio communication device comprises:
 a base band chip having a low-frequency signal processing unit for processing a signal in the first frequency band; and
 a plurality of high-frequency chips piled up on and bonded to the surface of the base band chip, and having high-frequency signal processing units for processing a signal in the second frequency band, the high-frequency chips being electrically connected to the base band chip without any matching circuits interposed between the base band chip and the high-frequency chips,
 wherein the high-frequency chips are disposed with the surfaces of the high-frequency chips opposite to the surface of the base band chip, and are connected to the base band chip by inter-chip connection members interposed between the opposite surfaces,
 wherein the inter-chip connection members include metal projections on the surface of at least one of the base band chip and the high-frequency chips, the metal projections having a height that is smaller than the height of a bump,
 wherein interconnections between the high-frequency chips are made via metal wiring on the surface of the base band chip, and
 wherein the metal projections and the metal wiring are both formed of non-oxidizable metal films.

2. A semiconductor device for a radio communication device according to claim 1, wherein the low-frequency signal processing unit includes a demodulator unit for demodulating a reception signal, and a signal processing unit for processing a signal demodulated by the demodulator unit.

3. A semiconductor device for a radio communication device according to claim 2, wherein the high-frequency signal processing units include a transmitter unit for giving a transmission signal to an antenna, and a receiver unit for frequency-converting a reception signal from the antenna and giving the frequency-converted reception signal to the demodulator unit.

4. A semiconductor device for a radio communication device according to claim 3, wherein the transmitter unit and the receiver unit are provided on different high-frequency chips.

5. A semiconductor device for a radio communication device according to claim 3, wherein the receiver unit includes a filter for filtering a reception signal from the antenna.

6. A semiconductor device for a radio communication device according to claim 5, wherein the filter is a surface acoustic wave filter.

7. A semiconductor device for a radio communication device according to claim 3, wherein the high-frequency signal processing units include a switch unit which selects a transmission signal from the transmitter unit and provides the same to the antenna, or which selects a reception signal from the antenna and provides the same to the receiver unit.

8. A semiconductor device for a radio communication device according to claim 1, wherein the base band chip and the high-frequency chips are made of respectively different types of semiconductor materials.

9. A semiconductor device for a radio communication device according to claim 1, wherein the base band chip is made of a silicon semiconductor and the high-frequency chips are made of a compound semiconductor.

10. A radio communication device that includes (i) a semiconductor device for a radio communication device in which a signal is received or transmitted after frequency-conversion between the frequency bands, the frequency band including a first frequency band and a second frequency band that is higher in frequency than the first frequency band, and (ii) an antenna connected to the semiconductor device, wherein the semiconductor device comprises,
 a base band chip having a low-frequency signal processing unit for processing a signal in the first frequency band; and
 a plurality of high-frequency chips piled up on and bonded to a surface of the base band chip, and having a high-frequency signal processing units for processing a signal in the second frequency band, the high-frequency chips is being electrically connected to the base band chip without any matching circuits interposed between the high-frequency chips and the base band chip,
 wherein the high-frequency chips are disposed with the surfaces of the high-frequency chips opposite to the surface of the base band chip, and are connected to the base band chip by inter-chip connection members interposed between the opposite surfaces,
 wherein the inter-chip connection members include metal projections on the surface of at least one of the base band chip and the high-frequency chips, the metal projections having a height that is smaller than the height of a bump,
 wherein interconnections between the high-frequency chips are made via metal wiring on the surface of the base band chip, and
 wherein the metal projections and the metal wiring are both formed of non-oxidizable metal films.

11. A radio communication device according to claim 10, wherein the low-frequency signal processing unit includes a demodulator unit for demodulating a reception signal, and a signal processing unit for processing a signal demodulated by the demodulator unit.

12. A radio communication device according to claim 11, wherein the high-frequency signal processing units include a transmitter unit for giving a transmission signal to the antenna, and a receiver unit for frequency-converting a reception signal from the antenna and giving the frequency-converted reception signal to the demodulator unit.

13. A radio communication device according to claim 12, wherein the receiver unit includes a filter for filtering a reception signal from the antenna.

14. A radio communication device according to claim 13, wherein the filter is a surface acoustic wave filter.

15. A radio communication device according to claim 12, wherein the high-frequency signal processing units include a switch unit which selects a transmission signal from the transmitter unit and provides the same to the antenna, or which selects a reception signal from the antenna and provides the same to the receiver unit.

16. A radio communication device according to claim 10, wherein the base band chip and the high-frequency chip are made of respectively different types of semiconductor materials.

* * * * *